United States Patent [19]

Lukes

[11] 4,433,301
[45] Feb. 21, 1984

[54] EQUALIZATION PREAMPLIFIER WITH HIGH FREQUENCY GAIN PEAKING

[75] Inventor: Henry J. Lukes, Bellevue, Wash.

[73] Assignee: Sundstrand Data Control, Inc., Rockford, Ill.

[21] Appl. No.: 262,372

[22] Filed: May 11, 1981

[51] Int. Cl.³ .............................................. H03F 3/191
[52] U.S. Cl. ..................................... 330/109; 330/304
[58] Field of Search ....................... 330/107, 109, 304; 333/28 R

[56] References Cited

FOREIGN PATENT DOCUMENTS 2158881  5/1973  Fed. Rep. of Germany ...... 330/107

OTHER PUBLICATIONS

Leonard Kaplan, "High Dynamic Range-Low Noise Pie Amplifier", RCA Technical Notes No. 985, Nov. 26, 1974.

Primary Examiner—James B. Mollins
Assistant Examiner—Gene Wan
Attorney, Agent, or Firm—Ted. E. Killingsworth; Michael B. McMurry; Harold A. Williamson

[57] ABSTRACT

Gain peaking and attenuation of audio signals above the peak gain frequency are provided in an audio frequency equalization preamplifier that includes an operational amplifier having a feedback network including first and second resistors and a feedback capacitor connected between the output and the second feedback resistor. Two or three low pass RC filter sections are connected between the audio signal source and the noninverting input of the operational amplifier with a circuit connecting a capacitor of the second RC section from the noninverting input to a node between the second feedback resistor and the feedback capacitor.

10 Claims, 6 Drawing Figures

EQUALIZATION PREAMPLIFIER WITH HIGH FREQUENCY GAIN PEAKING

TECHNICAL FIELD

The invention relates to the field of audio frequency equlization preamplifiers and, in particular, to audio frequency equalization preamplifiers with high frequency gain peaking utilizing operational amplifiers.

BACKGROUND OF THE INVENTION

Equalizing preamplifiers are used for amplifying and equalizing small audio signals from such audio signal sources as magnetic tape heads or phonograph cartridges. In equalizing frequency response, the preamplifier will produce a higher gain for low frequencies starting for example at 50 hertz and reducing the gain progressively through the audio frequency range. In addition, there is often a requirement for gain peaking at a particular frequency such as in the range of 10 to 15 kilohertz. There may also be a requirement for steep attenuation of the gain above a certain frequency such as 20 kilohertz because typically in audio systems, frequencies above 20 kilohertz do not contain any useable signal and only contribute to noise in the system.

In prior art equalization preamplifiers with a peaking capability utilizing an operational amplifier, peaking is accomplished with a resonant circuit containing an inductance in the feedback circuit of the operational amplifier. This approach has the disadvantage of using an inductor along with the additional disadvantage of not attentuating the frequencies above the peak frequency due to the impedance of the inductor in the feedback circuit. Another approach would be to use an active low pass filter with adjustable damping, but such a filter would require an additional amplifying stage resulting in a more complex circuit of higher cost.

SUMMARY OF THE INVENTION

It is therefore an object of the invention to provide an equalizing audio preamplifier circuit with high frequency gain peaking without utilizing an inductive element and providing for attenuation of the output signal above the peak frequency.

It is another object of the invention to provide an audio frequency equalizing preamplifier circuit that includes an operational amplifier having a feedback circuit connected between the inverting input terminal and the output terminal of the operational amplifier including a first and second resistor, wherein the resistance of the first resistor is greater than the resistance of the second resistor, along with a feedback capacitor connected in series between the second resistor and the operational amplifier output terminal. The equalizing preamplifier also includes an input filter including two or three low pass RC filter network sections connected in series between the signal source and the noninverting input of the operational amplifier along with a circuit connecting a capacitor of the second RC section from the noninverting terminal to the node of the feedback circuit between the feedback capacitor and the second resistor.

It is a further object of the invention to provide an audio frequency equalizing preamplifier circuit with high frequency gain peaking that includes an operational amplifier having a feedback circuit connected between output terminal and the inverting input terminal including a first and a second resistor, wherein the resistance of the first resistor is greater than the resistance of the second resistor, and a feedback capacitor connected in series between the second resistor and the output terminal of the operational amplifier. The preamplifier also includes an input filter comprised of two or three low pass RC sections connected in series to the noninverting terminal of the operational amplifier and a circuit including a tap arranged on the second resistor of the feedback circuit to which the lower end of the capacitor of the second RC section is connected. The position of the tap serves as a means of adjusting the height of peak gain of the preamplifier.

DETAILED DESCRIPTION OF THE INVENTION

Figure 2B:
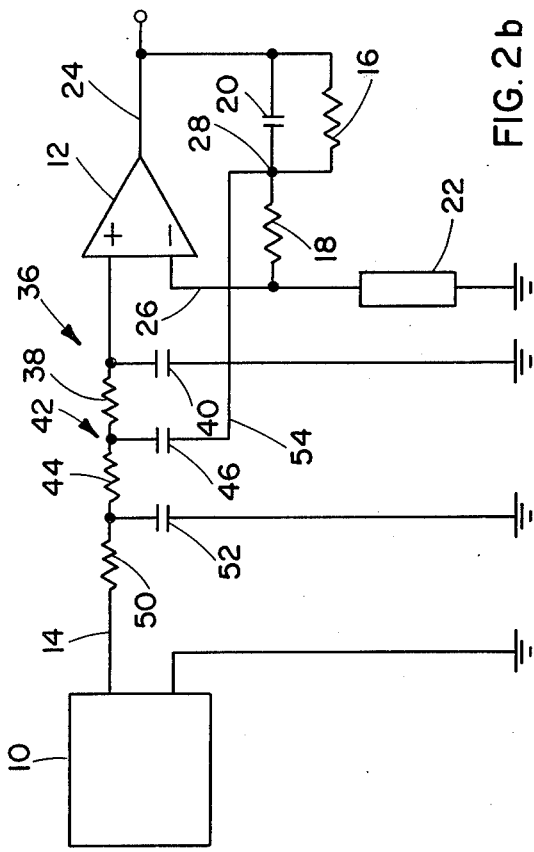
FIG. 2b is a schematic diagram of a second preamplifier circuit according to the invention.
Figure 1B:
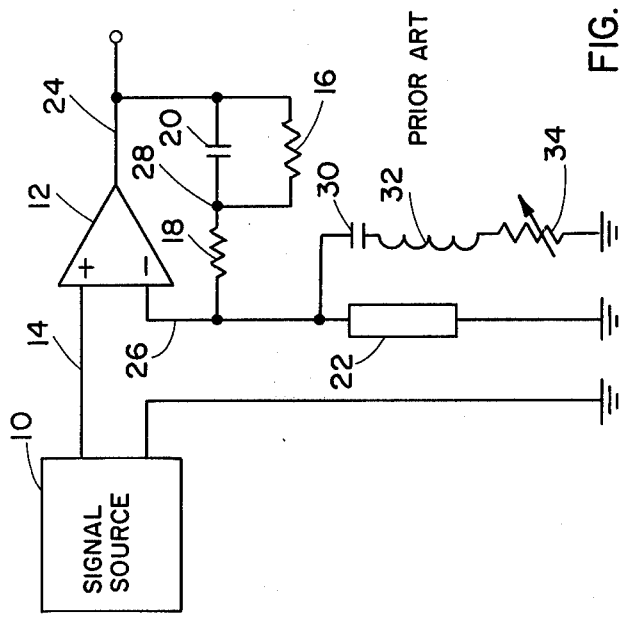
FIG. 1b is a schematic of another prior art equalizing preamplifier circuit.
Figure 2A:
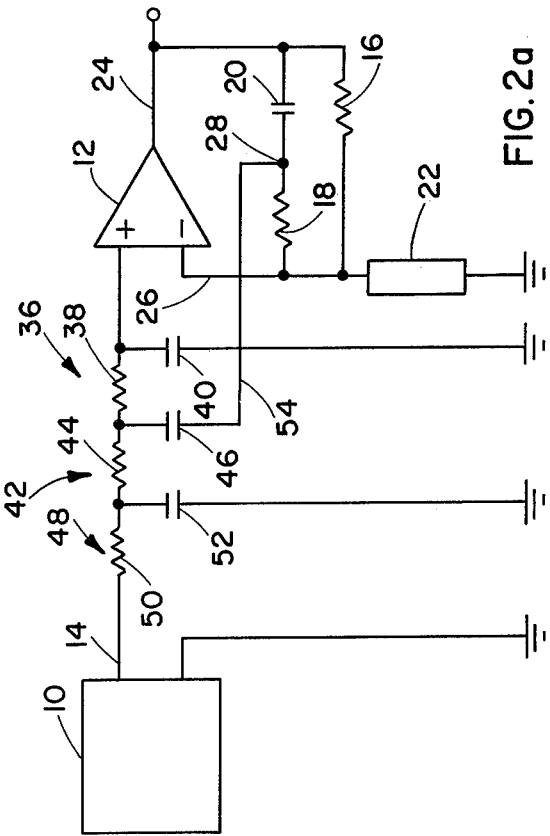
FIG. 2a is a schematic diagram of an equalizing preamplifier circuit according to the invention.
Figure 1A:
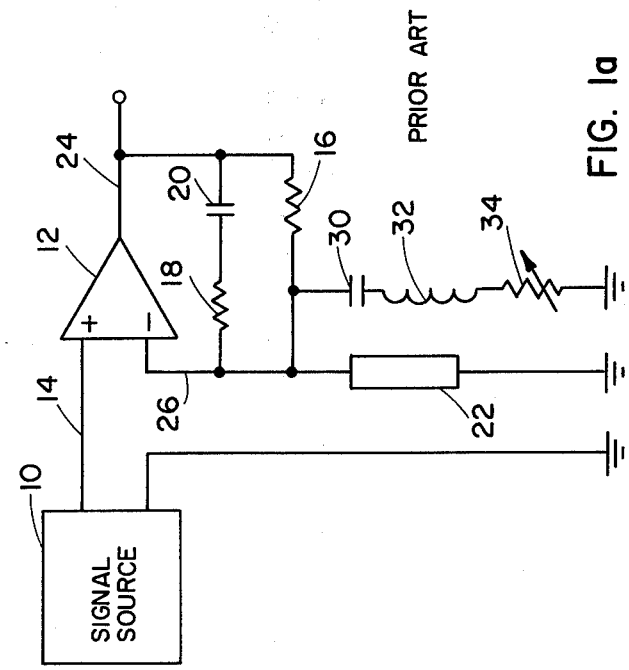
FIG. 1a is a schematic of a prior art equalizing preamplifier circuit.

In FIGS. 1a and 2a are illustrated examples of prior art equaliziation preamplifiers with high frequency gain peaking. An audio frequency signal source 10 such as a magnetic tape head or a phonograph cartridge generates a audio frequency signal which is applied to a noninverting input terminal of an operational amplifier 12 by means of a line 14. Referring to FIG. 1a, a feedback network or circuit including resistors 16 and 18, a feedback capacitor 20 and an impedance 22 is connected between the output terminal of the operational amplifier 12 by means of line 24 and the inverting input of the operational amplifier 12 by means of line 26. The circuit of FIG. 1b is similar to the circuit of FIG. 1a except that the first resistor 16 is connected in parallel to capacitor 20 instead of being connected in parallel to both resistor 18 and capacitor 20 as in the circuit of FIG. 1a.

Since both of the prior art circuits of FIGS. 1a and 1b are required to produce a considerably higher gain for low frequencies starting for example at 50 hertz than for higher audio frequencies in the range of 1 to 3 kilohertz, the first resistor 16 in the feedback network will have a relatively high value of, for example, in the range of 50 kilohms that determines the low frequency gain of the preamplifier. The second resistor 18, typically having a resistance on the order of 2 kilohms, which is connected in both cases in series with the capacitor 20 will determine the high frequency gain of the circuit. In both circuits of FIGS. 1a and 1b the operation of the second resistor 18 in combination with the capacitor 20 will gradually reduce the gain of the operational amplifier 12 as the frequency from the signal source 10 increases.

In addition to the equalizing function just described, audio preamplifier circuits quite frequently require additional capabilities such as a gain peaking which will, for instance, produce a peak at a predetermined frequency between 10 and 15 kilohertz. Further, it is often useful to attenuate frequencies above 20 kilohertz in order to eliminate these frequencies as source of noise in the audio system. In the prior art preamplifiers illustrated in FIGS. 1a and 1b, this peaking requirement is accomplished by means of a resonant circuit of the type shown in FIGS. 1a and 1b consisting of a capacitor 30, an inductor 32 and an adjustable resistor 34 connected in parallel to the grounded impedance 22. The adjustable resistor 34 allows for the adjustment of the peak height of the preamplifier circuit. However, the circuits illustrated in FIGS. 1a and 1b have two significant disadvantages, the first of which is the utilization of an inductor in the circuit. Secondly, the circuits as illustrated in FIGS. 1a and 1b do not provide for attenuation of the frequencies above the high frequency gain peak because the resonant circuit comprised of the capacitor 30, inductor 32 and resistance 34 is effectively disconnected for high audio frequencies due to the impedance of the inductor 32. As indicated before, it would be possible to use an active low pass filter with adjustable damping to avoid these disadvantages, but such a filter would require an additional amplifying stage which results in more components with concomitant higher costs.

Figure 3:
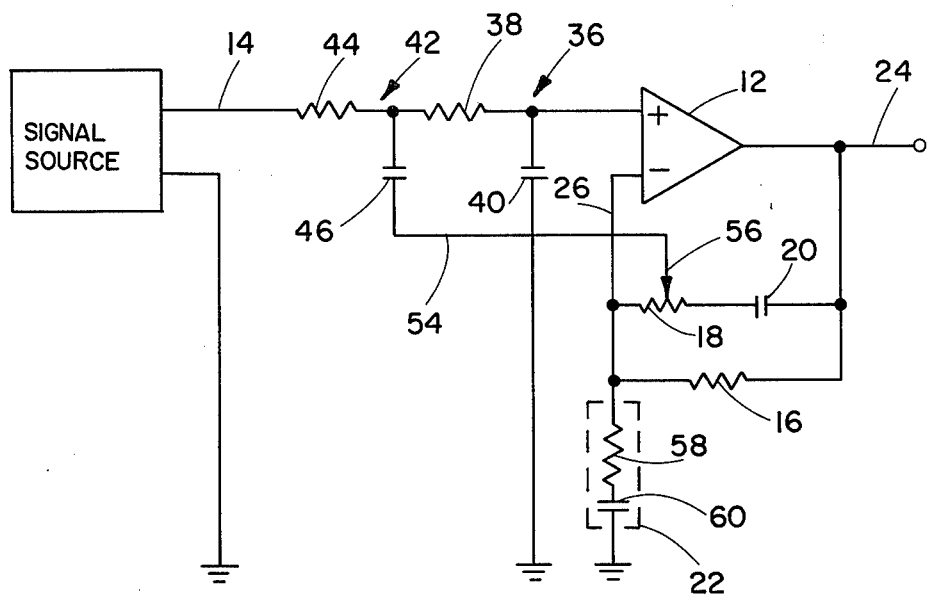
FIG. 3 is a schematic diagram of a third preamplifier circuit according to the invention.

Illustrated in FIGS. 2a, 2b and 3 are equalization preamplifier circuits designed to overcome the basic disadvantages of the circuits illustrated in FIGS. 1a and 1b in that they provide the basic equalizing properties of the circuits of FIGS. 1a and 1b but, also, function as active low pass filters with adjustable peak height and attenuate frequencies above the peak frequency. In the circuits of FIGS. 2a and 2b the operational amplifier 12 and the basic feedback network including resistors 16 and 18 and capacitor 20 are the same as in the circuits of FIGS. 1a and 1b. The circuits of FIGS. 2a and 2b, however, do include additional circuit elements including a three section low pass RC network included in line 14 between the signal source 10 and the noninverting input terminal of the amplifier 12. The first low pass RC section 36 includes a resistor 38 and a capacitor 40, the second RC section 42 includes a resistor 44 and a capacitor 46 and the third RC section 48 includes a resistor 50 and a capacitor 52. It should be noted that the convention used in the specification and claims is to number the RC filter section from the noninverting input of the operational amplifier 12, which is the reverse of the conventional practice of numbering from left to right. For proper operation, the first two RC sections 36 and 42 are necessary and the third RC section 48 is optional.

In active filters of the type shown in FIGS. 2a and 2b, the lower terminal of the capacitor 46 of the second RC section 42 from the noninverting terminal of the operational amplifier 12 is connected to the output 24 of the operational amplifier 12 so that this filter section 42 receives the amplified output signal. However, due to the equalizing properties of the amplifier circuits shown in 2a and 2b, connecting capacitor 46 to the output 24 of the operational amplifier 12 would result in an undesirable distortion of the frequency response because the amplifier 12 has a different voltage gain for different frequencies. The present invention overcomes this problem, by connecting the lower terminal of the capacitor 46, by means of line 54, to the node 28 between resistor 18 and capacitor 20. An alternative arrangement is illustrated in FIG. 3 wherein the capacitor 46 is connected, by means of line 54, to the tap 56 which is arranged on the resistor 18. When the tap 56 takes the form of an adjustable slider on the resistor 18, this combination forms an adjustable potentiometer which will permit the height of the peak to be adjusted as shown in FIG. 4.

For low frequency, the feedback capacitor 20 in the circuits of FIGS. 2a, 2b and 3 will reduce the output voltage across the resistor 18 in the operational amplifier feedback network to a negligible value such that the capacitor 46 in the RC network 42 will receive very little feedback voltage thereby resulting in very little filter effect for low frequencies. However, for higher frequency input signals on line 14, feedback capacitor 20 will represent a practically direct connection of the feedback resistor 18 between the output 24 and the inverting input of the operational amplifier 12 so that the amplifier circuit will function as a true active filter. By selecting the proper ratio between values of capacitors 40 and 46 of RC networks 36 and 42 and capacitor 52 if a third RC network 48 is used, it is possible to obtain an underdamped response along with a desired peak in amplifier gain when capacitor 46 is connected directly to node 28. The peak gain can be reduced to a flat response by shifting tap 56 along resistor 18 to the left closer to the inverting input of the operational amplifier 12. This flat response can be of various types including Butterworth or Tchebyschev, depending upon the ratio between the values of capacitors 40, 46 and 52. When the tap 56 is shifted completely to the left of resistor 18, there will be no feedback voltage to capacitor 46 with the result that the filter of FIG. 3 will function as a passive filter with a very flat response.

The preferred embodiment of the invention is illustrated in FIG. 3 with the circuit elements shown in FIG. 3 having the following values: Resistors 38 and 44 have a resistance of 6.2 kilohms; capacitor 46 has a capacitance of 1.2 nF; capacitor 40 has a capacitance of 2.2 nF; resistor 18 has a resistance of 1 kilohm; resistor 16 has a resistance of 24 kilohms; and capacitor 20 has a capacitance of 91 nF. The resistance of the first feedback resistor 16 is greater than the resistance of the second feedback resistor 18. Also, in the preferred embodiment of the invention shown in FIG. 3, impedance 22 is comprised of a resistor 58 having a value of 330 ohms and a capacitor 60 having a capacitance of 33 $\mu$F.

Figure 4:
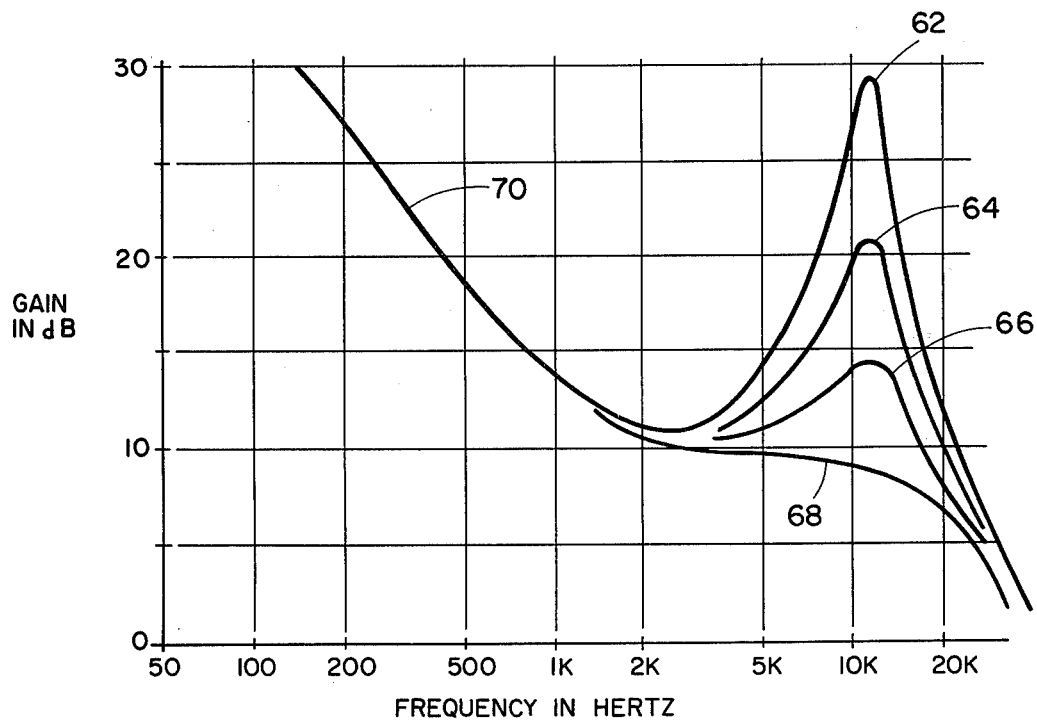
FIG. 4 is a graphical representation of the frequency response of the circuit of FIG. 3.

In FIG. 4 of the drawings is illustrated the gain versus frequency response of the amplifying stage shown in FIG. 3 for four different positions of the tap 56 on resistor 18. As shown in FIG. 4, the peak gain indicated at 62 represents the configuration in FIG. 3 when tap 56 is all the way to the right of resistor 18 and is connected at what would be the equivalent of the node 28 in FIG. 2a. As the tap is moved progressively to the left, the peak height of the preamplifier circuit of FIG. 3 will be reduced progressively as illustrated by peaks 64 and 66 until the tap reaches all the way to the left of resistor 18 in which case the frequency response will be essentially flat as indicated by line 68 on FIG. 4. As shown in FIG. 4, the frequency of the peak of the preamplifier circuit will be essentially constant but the actual peak height will depend on the position of the tap 56 on resistor 18. Also as shown in FIG. 4, there is a steep attenuation of the amplifier gain above the peak frequency which in the case shown in FIG. 4 will be 12 dB per octave and approaches 18 dB per octave in the case of the three section input filter as shown in FIGS. 2a and 2b. It should also be noted that the response of the amplifier of FIGS. 2a, 2b and 3 will include the low frequency boost as indicated by line 70 which results from the equalizing function of components 16, 18, 20.

The peak frequency $f_p$ of the preamplifier circuit shown in FIG. 3 can be computed by utilizing equation (1) below:

$$f_p = \frac{1}{2\pi R_O \sqrt{C_1 C_2}} \quad (1)$$

In equation (1), $C_1$ represents the capacitance of capacitor 40 and $C_2$ represents the capacitance of capacitor 46 and resistance $R_O$ represents the resistance of resistors 38 and 44, which have the same value.

The quality factor Q of the filter will be approximately equal to the height of the peak gain and is represented by equaation (2) below:

$$Q = \frac{\sqrt{\frac{C_2}{C_1}}}{2 - \frac{C_2}{C_1}(A_O - 1)} \quad (2)$$

In equation (2), $A_O$ represents the voltage gain of the amplifier for high frequency signals which is approximately equal to $(1+r/Z)$ when capacitor 46 is connected directly to node 28 between resistor 18 and capacitor 20. In this equation, Z represents the value of impedance 22 and r represents the resistance of resistor 18. It should be noted that equations similar to equations (1) and (2) can be derived for the preamplifier circuit having three input RC sections as shown in FIGS. 2a and 2b.

I claim:

1. An equalizing preamplifier circuit comprising:
   an operational amplifier having an inverting input terminal, a noninverting input terminal and an output terminal;
   a feedback circuit connected between said inverting input terminal and said output terminal including a first resistor and a second resistor wherein the resistance of said first resistor is greater than the resistance of said second resistor and a feedback capacitor connected in series between said second resistor and said operational amplifier output terminal;
   an input filter including two low pass RC sections connected to said operational amplifier noninverting input; and
   means for connecting a capacitor of the second RC section from said noninverting terminal to the node of said feedback circuit between said feedback capacitor and said second resistor.

2. The circuit of claim 1 wherein said input filter includes an additional low pass RC filter section.

3. An equalizing preamplifier circuit comprising:
   an operational amplifier having an inverting input terminal, a noninverting input terminal adapted for connection to a signal source and an output terminal;
   a feedback circuit connected between said inverting input terminal and said output terminal including a first and a second resistor, wherein the resistance of said first resistor is greater than said second resistor, and a feedback capacitor connected in series between said second resistor and said operational amplifier output terminal;
   an input filter including two low pass RC sections connected to said operational amplifier noninverting terminal; and
   means, including a tap connected to said second resistor, for connecting a capacitor of the second RC network from said inverting terminal to said tap.

4. The amplifier of claim 3 wherein said tap includes a slider connected to said second resistor.

5. The amplifier of claim 3 or 4 wherein said input filter includes an additional low pass filter section.

6. An audio equalizing preamplifier for receiviing a signal from an audio signal source comprising:
   an operational amplifier having an inverting input terminal, a noninverting input terminal and an output terminal;
   a feedback circuit connected between said inverting input terminal and said output terminal including a first resistor and a second resistor wherein the resistance of said first resistor is greater than the resistance of said second resistor and a feedback capacitor connected in series between said second resistor and said operational amplifier output terminal;
   an input filter including two low pass RC sections connected to said operational amplifier noninverting input; and
   means for connecting a capacitor of the second RC section from said noninverting terminal to the node of said feedback circuit between said feedback capacitor and said second resistor.

7. The circuit of claim 6 wherein said input filter includes an additional low pass RC filter section.

8. An audio equalizing preamplifier for receiving a signal from an audio signal source comprising:
   an operational amplifier having an inverting input terminal, a noninverting input terminal adapted for connection to the signal source and an output terminal;
   a feedback circuit connected between said inverting input terminal and said output terminal including a first and a second resistor, wherein the resistance of said first resistor is greater than said second resistor, and a feedback capacitor connected in series between said second resistor and said operational amplifier output terminal;
   an input filter including two low pass RC sections connected in series between the signal source and said operational amplifier noninverting terminal; and
   means, including a tap connected to said second resistor, for connecting a capacitor of the second RC network from said inverting terminal to said tap.

9. The amplifier of claim 8 wherein said tap includes a slider connected to said second resistor.

10. The amplifier of claim 8 or 9 wherein said input filter includes an additional low pass filter section.

* * * * *